(12) United States Patent
Suzawa et al.

(10) Patent No.: US 6,284,577 B1
(45) Date of Patent: *Sep. 4, 2001

(54) MIS SEMICONDUCTOR DEVICE HAVING AN LDD STRUCTURE AND A MANUFACTURING METHOD THEREFOR

(75) Inventors: Hideomi Suzawa, Kanagawa; Shunpei Yamazaki, Tokyo; Yasuhiko Takemura, Kanagawa, all of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/383,415

(22) Filed: Aug. 26, 1999

Related U.S. Application Data

(62) Division of application No. 09/196,745, filed on Nov. 20, 1998, now abandoned, which is a division of application No. 08/561,531, filed on Nov. 21, 1995, now Pat. No. 5,851,861.

(30) Foreign Application Priority Data

Nov. 25, 1994 (JP) .................................................. 6-315633

(51) Int. Cl.⁷ ............................. H01L 21/00; H01L 21/20
(52) U.S. Cl. ........................ 438/163; 438/166; 438/477; 438/487; 438/676
(58) Field of Search ................................... 438/166, 487, 438/163, 477, 637, 676, 777, 710, 301, 303

(56) References Cited

U.S. PATENT DOCUMENTS

| 4,211,601 | 7/1980 | Mogab | 156/643.1 |
|---|---|---|---|
| 4,226,665 | 10/1980 | Mogab | 156/643.1 |
| 4,298,443 | 11/1981 | Mayden | 204/192 |
| 4,310,380 | 1/1982 | Flamm et al. | 156/643.1 |
| 4,314,875 | 2/1982 | Flamm | 156/643.1 |
| 4,498,953 | 2/1985 | Cook et al. | 156/646 |
| 4,624,882 | 11/1986 | Yang et al. | 427/74 |
| 5,023,204 | * 6/1991 | Adachi et al. | 437/228 |

(List continued on next page.)

FOREIGN PATENT DOCUMENTS 4-144238  5/1992 (JP) .

OTHER PUBLICATIONS

"A Novel Floating Gate Spacer Polysilicon TFT" Zhao et al. Center for Integrated Systems, Stanford University, Stanford CA 94305; 1993 IEEE pp. 15.4.1–15.4.4. No month given.
"A Novel Submicron LDD Transistor With Inverst–T Gate Structure", Huang et al.; Xerox Palo Alto Research Center, 1986 IEEE, 31.7. No month given.
Ghandi, Sorab K., "VLSI Fabrication Principles Silicon and Gallium Arsenide", Second Edition, John Wiley & Sons, Inc., pp. 630–634, 1994. No month given.

*Primary Examiner*—Michael Lebentritt
(74) *Attorney, Agent, or Firm*—Nixon Peabody LLP; Jeffrey L. Costellia

(57) ABSTRACT

It is intended to provide a method of forming a gate overlap lightly doped impurity region (GOLD). After a gate insulating film is formed by a material mainly made of silicon oxide and a gate electrode is formed with, for instance, silicon, lightly doped impurity regions are formed. A coating mainly made of silicon is formed on the entire surface including the surface of the gate electrode. Side walls mainly made of silicon are formed on the side faces of the gate electrode by anisotropically or semi-anisotropically etching the thus-formed coating in an atmosphere of $ClF_3$, for instance. In this etching step, since a selective etching ratio of the side walls to the gate insulating film is sufficiently large, etching of the gate insulating film is negligible. A source and a drain are then formed by doping an impurity at a high concentration using the gate electrode and the side walls as a mask.

24 Claims, 4 Drawing Sheets

U.S. PATENT DOCUMENTS

| | | | |
|---|---|---|---|
| 5,091,763 | 2/1992 | Sanchez | 437/44 |
| 5,217,913 | 6/1993 | Watabe et al. | 438/303 |
| 5,223,457 | 6/1993 | Mintz et al. | 437/225 |
| 5,259,922 | 11/1993 | Yamano et al. | 156/643 |
| 5,358,879 | 10/1994 | Brady et al. | 437/44 |
| 5,426,327 | 6/1995 | Murai . | |
| 5,770,506 | 6/1998 | Koh | 438/303 |
| 5,851,861 * | 12/1998 | Suzawa et al. | 438/166 |
| 5,993,614 * | 11/1999 | Nomura | 427/45.1 |
| 6,033,990 * | 3/2000 | Kishimoto et al. | 438/637 |

* cited by examiner

MIS SEMICONDUCTOR DEVICE HAVING AN LDD STRUCTURE AND A MANUFACTURING METHOD THEREFOR

This application is a Division of application Ser. No. 09/196,745 filed Nov. 20, 1998 now abandoned which itself is a Division of application Ser. No. 08/561,531 filed Nov. 21, 1995, now U.S. Pat. No. 5,881,861.

BACKGROUND OF THE INVENTION

1. Field of the Invention

The present invention relates to a MIS (metal-insulator-semiconductor) semiconductor device such as a MOS field-effect transistor and to a manufacturing method therefor. The MIS semiconductor device according to the present invention is used in various semiconductor integrated circuits.

2. Description of the Related Art

With the size reduction in design rules of MIS semiconductor devices, a strong electric field between the drain and the channel now causes a hot carrier injection phenomenon. Degradations in characteristics due to the size reduction in design rules (i.e., shortening of the channel) are generally called short channel effects. To suppress the short channel effects, as shown in FIG. 4, a MIS field effect transistor having lightly doped impurity regions (lightly doped drain) 406 and 407 has been developed.

In this type of device, the LDDs 406 and 407 having an impurity concentration lower than a source 404 and a drain 405 are provided between the source 404 and -a channel forming region and between the drain 405 and the channel forming region. Having an effect of reducing the electric field, the LDDs 406 and 407 can suppress generation of hot carriers.

Conventionally, the LDDs 406 and 407 shown in FIG. 4 are formed in the following manner. After a gate electrode 401 is formed, lightly doped impurity regions are formed by doping. Then, side walls 402 are formed with an insulating material such as silicon oxide, and the source and drain 404 and 405 are formed by conducting doping in a self-aligned manner using the side walls 402 as a mask.

However, since the gate electrode 401 does not extends over the LDDs 406 and 407, the further channel reduction has caused a phenomenon in which hot carriers are trapped in portions of a gate insulating film 403 over the LDDs 406 and 407. The trapping of hot carriers, particularly hot electrons, reverses the conductivity type of the LDDs 406 and 407, to unavoidably causes such short channel effects as a threshold voltage variation, an increase of the subthreshold coefficient, and a reduction of the punch-through breakdown voltage.

To solve the above problem, the overlap LDD (GOLD) structure has been proposed in which the LDDs are also covered with the gate electrode. By employing this structure, there can be avoided the above-mentioned degradation in characteristics which would otherwise be caused by hot carriers trapped in the gate electrode over the LDDs.

As the MIS field-effect transistors having the GOLD structure, there was reported an IT-LDD structure (T.Y. Huang: IEDM Tech. Digest 742 (1986)). The IT-LDD structure means a LDD structure having an inverse-T gate electrode. FIGS. 3A to 3E schematically show a manufacturing method of such a transistor.

After a field insulating film 302 and a gate insulating film 303 are formed on a semiconductor substrate 301, a conductive coating 304 of, for instance, polycrystalline silicon is formed. (FIG. 3A)

A gate electrode 306 is then formed by etching the conductive coating 304 to a proper extent. Care should be taken not to etch the conductive coating 304 completely; that is, only portions 305 indicated by dashed lines should be etched to leave portions having a proper thickness (100 to 1,000 Å) around the gate electrode 304, to thereby form a thin conductive coating 307. Therefore, this etching step is very difficult.

LDDs 308 and 309 are formed by through-doping that is performed through the thin conductive coating 307 and the gate insulating film 303. (FIG. 3B)

A coating 310 is then formed on the entire surface with such a material as silicon oxide. (FIG. 3C)

Subsequently, side walls 312 are formed by anisotropically etching the coating 310 in the same manner as in the case of producing the conventional LDD structure. The thin conductive coating 307 is also etched in this etching step. A source 313 and a drain 314 are formed by conducting doping in a self-aligned manner using the side walls 312 as a mask. (FIG. 3D)

Thereafter, an interlayer insulating film 315, a source electrode/wiring 316, and a drain electrode/wiring 317 are formed to complete a MIS field-effect transistor. (FIG. 3E)

The resulting structure is called IT-LDD because the gate electrode portion assumes an inverse-T as is apparent from the figures. In the IT-LDD structure, in which the thinner portions of the gate electrode exist over the LDDs, the carrier density in the LDD surfaces can be controlled to a certain extent from the gate electrode. As a result, even if the impurity concentration of the LDDs is lowered, there can be reduced the possibility of a reduction of the mutual conductance due to a series resistance of the LDDs or variations of the device characteristics due to hot carriers injected into the portions of the insulating film over the LDDs.

These advantages are not specific to the IT-LDD structure, but common to all kinds of GOLD structures. Capable of lowering the impurity concentration of the LDDs, the GOLD structure has a large effect of reducing the electric field strength. Further, since the LDDs can be made shallow, the GOLD structure can suppress the short channel effects and the punch-through.

There are no effective GOLD structure manufacturing methods other than the method of the IT-LDD structure. Although the IT-LDD structure have many advantages described above, it is very difficult to produce it. In particular, it is very difficult to control the etching of the conductive coating 307 (see FIG. 3B). If there occurs a variation of the thickness of the thin conductive coating 307 among substrates or within a substrate, the impurity concentration of the source and drain varies, resulting in variations of the transistor characteristics.

SUMMARY OF THE INVENTION

The present invention has been made in view of the above problems in the art, and has an object of presenting a GOLD structure which can be produced more easily.

According to the present invention, a manufacturing method of a MIS semiconductor device comprises the steps of:

(1) forming a gate insulating film on a surface of a semiconductor;
(2) forming a gate electrode central portion;
(3) forming a lightly doped impurity region (LDD) in the semiconductor in a self-aligned manner using the gate electrode central portion as a mask;

(4) forming a conductive coating mainly made of silicon;

(5) forming a side wall spacer on a side face of the gate electrode central portion by anisotropically or semi-anisotropically etching the conductive coating in an atmosphere including a halogen fluoride; and (6) forming a source or a drain in a self-aligned manner using the side wall as a mask.

The MIS semiconductor device produced by the above method is characterized by:

the gate electrode central portion formed on the gate insulating film;

the gate electrode side portion mainly made of silicon and formed in close contact with the side face of the gate electrode central portion; and the LDD formed in the semiconductor under the gate electrode side portion between the drain (or source) and the channel forming region.

The MIS semiconductor device is further characterized in that a single insulating film mainly made of silicon oxide is formed on the drain, source, channel forming region, and LDD.

In the semiconductor device manufacturing method according to the present invention, the side wall is formed with a conductive material mainly made of silicon (i.e., formed with silicon having purity of more than 95%). That is, a GOLD structure is obtained by making the side wall a part of the gate electrode. To obtain such a structure, after a conductive coating mainly made of silicon is so formed as to cover a portion to become the gate electrode central portion, anisotropic or semi-anisotropic etching is performed in an atmosphere including a halogen fluoride. A halogen fluoride is represented by a chemical formula $XF_n$ where X is halogen excluding fluorine and n is an integer. For example, $ClF$, $ClF_3$, $BrF$, $BrF_3$, $IF$ and $IF_3$ may be used.

In the above description, the "gate electrode central portion" is a part of a gate electrode and corresponds to the gate electrode 401 of the conventional device shown in FIG. 4. Also, in the present invention, the portion (402 in FIG. 4) corresponding to the side wall of the conventional LDD structure is made of a conductive material having silicon as the main component. That portion is called the gate electrode side portion as well as the side wall with a consideration that it is another part of the gate electrode.

It is preferred that the gate electrode central portion be mainly made of silicon, i.e., made of silicon having purity of more than 95%.

It is difficult to stop the etching for forming the side wall by means of the gate insulating film mainly made of silicon oxide, possibly resulting in overetching of the substrate. This is due to the facts that ordinary dry etching cannot provide a sufficiently large selective etching ratio of silicon to silicon oxide, and that the thickness of the gate insulating film is smaller (about 1/10) than that of the gate electrode (i.e., side wall).

The investigations of the inventors of the present invention have revealed that the above problems can be solved by etching with a halogen fluoride. This is based on the fact that while a halogen fluoride has a strong action of etching silicon, it has only a weak action of etching silicon oxide.

According to the present invention, in the etching for forming the side wall, it is possible to make the selective etching ratio of the side wall to the gate insulating film sufficiently large. As a result, overetching of not only the semiconductor substrate but also the gate insulating film can be avoided.

However, while it is possible to perform isotropic etching using a halogen fluoride gas in a normal gas phase, it cannot realize anisotropic or semi-anisotropic etching. After conducting investigations under various conditions, the inventors have found that the anisotropy of gas etching can be improved by additionally using plasma excitation in a weak RIE (reactive ion etching) mode. This is based on the feature that plasma-damaged portion are likely etched by a halogen fluoride. The anisotropy of etching can be improved by causing plasma ions or electrodes to strike the substrate vertically. In a typical example, it was possible to make the vertical etching rate 2 to 10 times faster than the horizontal one.

For the purpose of anisotropic etching, it is preferred that an atmosphere be mixed with a gas, such as an argon gas, which helps generate plasma. It is further preferred to provide a mechanism capable of applying ions after accelerating those. However, it should be noted that excessive plasma excitation causes reduction of the selective etching ratio of silicon to silicon oxide.

In the conventional dry etching, the function of plasma is to generate an active species such as a fluoride ion. On the other hand, in the etching of the present invention, plasma serves only to activate the surface to be etched, i.e., facilitate its etching. The etching itself is performed by a halogen fluoride. In other words, the halogen fluoride gas may not be necessarily converted to a plasma. Rather, it is only necessary to create a plasma which is sufficient to treat a surface so that the surface states on an upper surface and a side surface differ from each other.

The present invention is characterized in that anisotropic etching is performed by using a halogen fluoride. As for the details of the anisotropic etching, there may be used methods other than the above mentioned method of using plasma.

DETAILED DESCRIPTION OF THE PREFERRED EMBODIMENTS

Embodiment 1

Figure 1A:
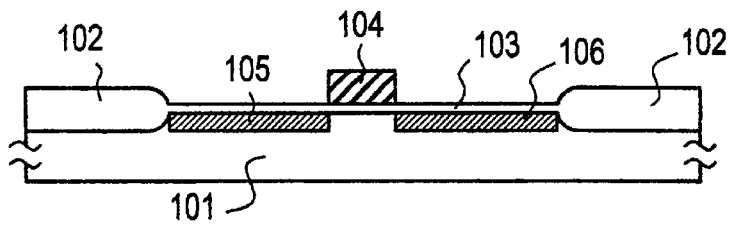
FIGS. 1A to 1E show a manufacturing method of a GOLD transistor according to a first embodiment of the present invention.

FIGS. 1A to 1E show a manufacturing method according to this embodiment. First, a field insulating film 102 having a thickness of 3,000 Å to 1 $\mu$m was formed on a silicon substrate 101 by a known LOCOS forming method. A silicon oxide film having a thickness of 100 to 500 Å as a gate insulating film 103 was then formed by thermal oxidation. A polycrystalline silicon film having a thickness of 2,000 to 5,000 Å whose conductivity was increased by doping of phosphorus was deposited by thermal CVD, and etched into a central portion 104 of a gate electrode. Further, N-type, lightly doped impurity regions (hereinafter called LDDs) 105 and 106 were formed by implanting phosphorus ions in a self-aligned manner using the gate electrode central portion 104 as a mask. It was preferable that the LDDs 105 and 106 have a phosphorus concentration of $1\times10^{16}$ to $1\times10^{17}$ atoms/cm$^3$ and a depth of 300 to 1,000 Å. (FIG. 1A)

Figure 1B:
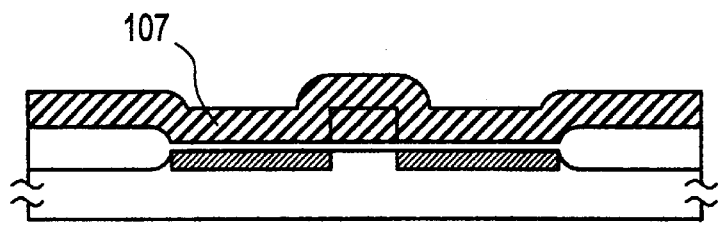

Subsequently, a polycrystalline silicon film 107 having a thickness of 2,000 Å to 1 μm whose conductivity was increased by doping of phosphorus was deposited by thermal CVD. (FIG. 1B)

Thereafter, anisotropic etching was performed with $ClF_3$ in the following manner. The substrate was placed in an etching chamber (the same as the one used for ordinary dry etching), a mixed gas of argon and $ClF_3$ was introduced into the chamber, and RF discharge was effected. Flow rates of argon and $ClF_3$ were respectively set at 100 sccm and 50 sccm, and the pressure was set at 0.1 Torr. The substrate was self-biased at −50 to −200 V. The etching was almost stopped by the gate insulating film 103, to exhibit almost no overetching.

Figure 1C:
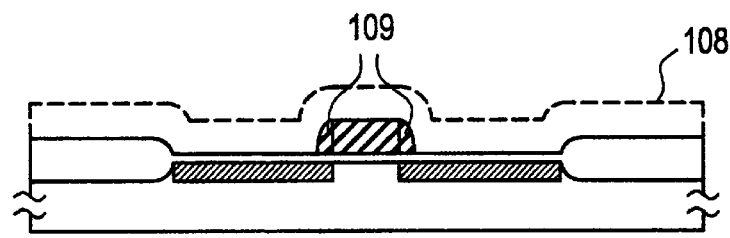

As a result, a portion 108 of the polycrystalline silicon film 107 indicated by a dashed line was etched to form gate electrode side portions 109, i.e., what is called side walls, on the side faces of the gate electrode central portion 104. Under the conditions of this embodiment, semi-anisotropic etching was effected in which the vertical etching rate was about two times of the horizontal one. Therefore, the gate electrode side portions 109 were somewhat narrower than in the case of the complete anisotropic etching. (FIG. 1C)

Figure 1D:
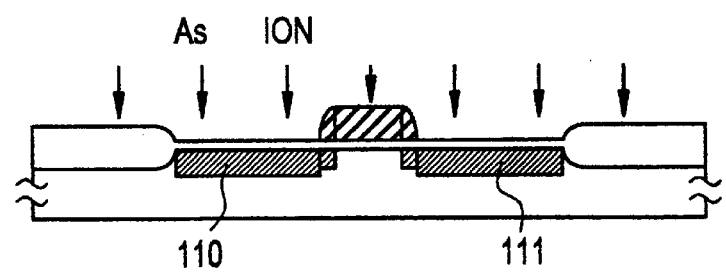

Subsequently, a source 110 and a drain 111 were formed by conducting doping (implantation of arsenic ions) in a self-aligned manner using the gate electrode central portion 104 and the side portions 109 as a mask. The arsenic concentration was set at $1 \times 10^{19}$ to $5 \times 10^{20}$ atoms/cm$^3$. The LDDs 105 and 106 and the source and drain 110 and 111 were then re-crystallized by thermal annealing. (FIG. 1D)

Figure 1E:
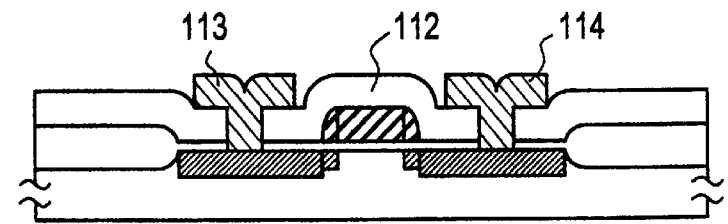

Thereafter, a silicon oxide film 112 having a thickness of 3,000 Å to 1 μm as an interlayer insulating film was deposited by thermal CVD. After contact holes were formed in the silicon oxide film 112, a source electrode 113 and a drain electrode 114 were formed. Thus, a GOLD transistor was formed. (FIG. 1E)

Embodiment 2

Figure 2A:
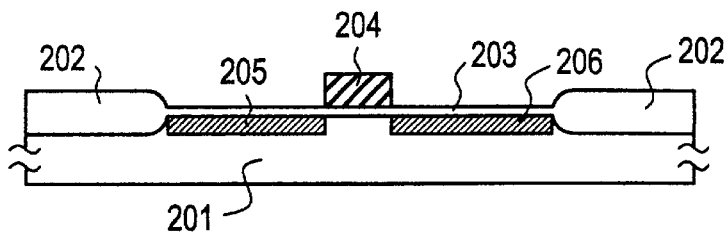
FIGS. 2A to 2E show a manufacturing method of a GOLD transistor according to a second embodiment of the present invention.

FIGS. 2A to 2E show a manufacturing method according to this embodiment. First, a field insulating film 202 having a thickness of 3,000 Å to 1 μm was formed on a silicon substrate 201, and a silicon oxide film having a thickness of 100 to 500 Å as a gate insulating film 203 was formed thereon by thermal oxidation. A central portion 204 of a gate electrode was formed by using a polycrystalline silicon film having a thickness of 2,000 to 5,000 Å whose conductivity was increased by doping of phosphorus. Further, N-type LDDs 205 and 206 were formed by implanting phosphorus ions in a self-aligned manner using the gate electrode central portion 104 as a mask. (FIG. 2A)

Figure 2B:
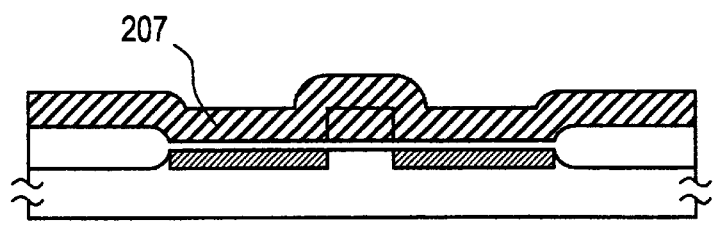

Subsequently, a polycrystalline silicon film 207 having a thickness of 2,000 Å to 1 μm whose conductivity was increased by doping of phosphorus was deposited by thermal CVD. (FIG. 2B)

Thereafter, anisotropic etching was performed with $ClF_3$ in the following manner.

Figure 5:
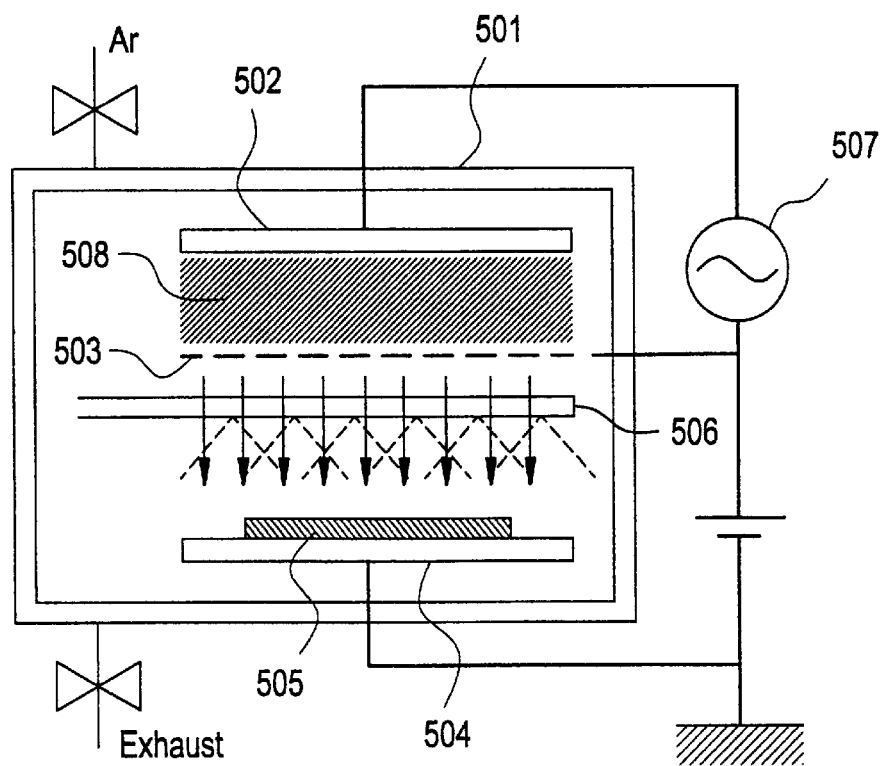
FIG. 5 schematically shows an etching apparatus used in the second embodiment.

An etching apparatus having a structure shown in FIG. 5 was used. A substrate 505 in the state of FIG. 2B was placed on a cathode 504 of a chamber 501. An argon gas was introduced into the chamber 501, and plasma 508 was generated between an anode 502 and a grid 503 by means of a RF power supply 507. On the other hand, a voltage difference between the cathode 504 and the grid 503 was kept at such a value as to make the potential of the anode 502 negative (−100 to −1,000 V). As a result, argon ions were accelerated toward the cathode 504 through the grid 503, and struck the substrate 505 approximately vertically.

On the other hand, a $ClF_3$ gas was jetted toward the cathode 504 from shower-like gas inlets 506 that were disposed between the grid 507 and the cathode 504. As a result, ion-damaged portions of the substrate 505 were selectively etched, so that the anisotropy of the etching was increased to 10:1 in this embodiment.

Figure 2C:
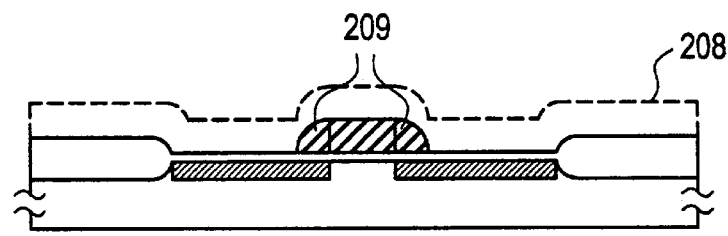

In the above manner, a portion 208 of the polycrystalline silicon film 207 indicated by a dashed line was etched to form gate electrode side portions 209, i.e., what is called side walls, on the side faces of the gate electrode central portion 204. (FIG. 2C)

Figure 2D:
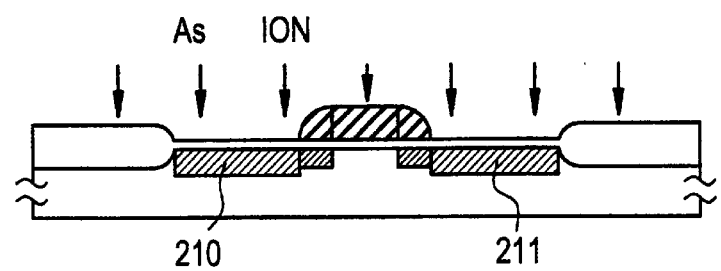

Subsequently, a source 210 and a drain 211 were formed by conducting doping (implantation of arsenic ions) in a self-aligned manner using the gate electrode central portion 204 and the side portions 209 as a mask. The LDDs 205 and 206 and the source and drain 210 and 211 were then re-crystallized by thermal annealing. (FIG. 2D)

Figure 2E:
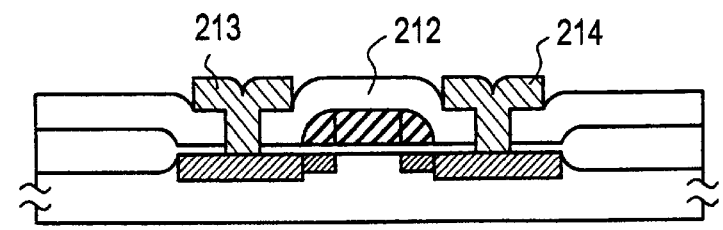
Figure 3A:
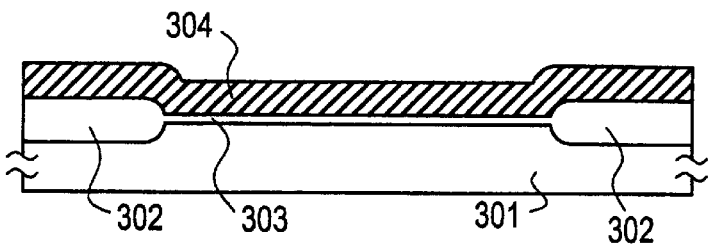
FIGS. 3A to 3E show a manufacturing method of an IT-LDD transistor according to a conventional method.
Figure 3B:
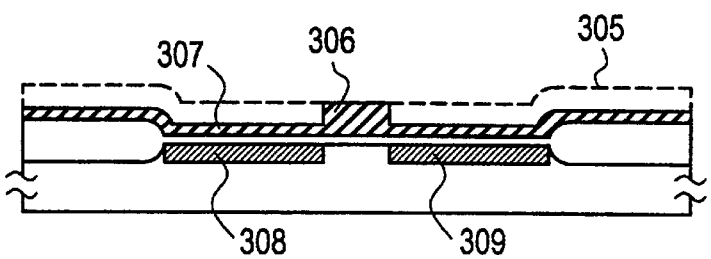
Figure 3C:
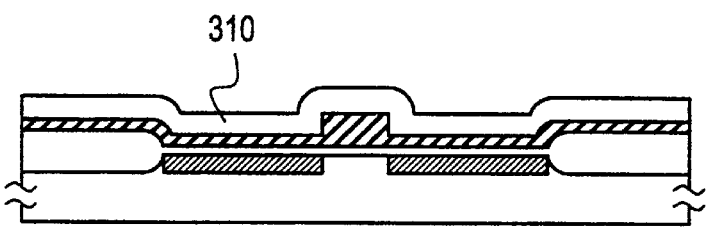
Figure 3D:
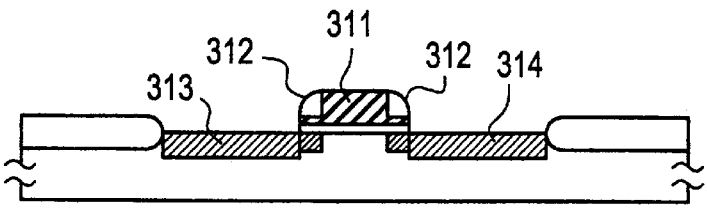
Figure 3E:
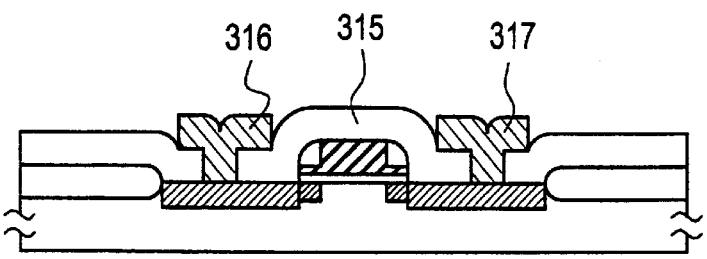
Figure 4:
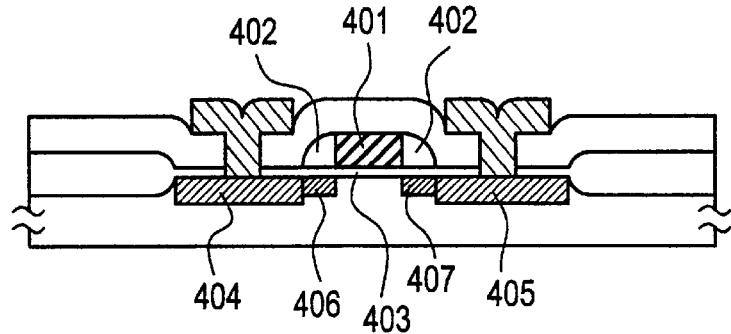
FIG. 4 shows a transistor having a conventional LDD structure.

Thereafter, a silicon oxide film having a thickness of 3,000 Å to 1 μm as an interlayer insulating film 212 was deposited. After contact holes were formed in the interlayer insulating film 212, a source electrode 213 and a drain electrode 214 were formed. Thus, a GOLD transistor was formed. (FIG. 2E)

Although in the above embodiments, plasma was used for the anisotropic etching with a halogen fluoride, it would be apparent that in the invention other methods can provide similar effects as long as they are anisotropic or semi-anisotropic etching. Further, although the above embodiments are directed to the case of forming a transistor within a semiconductor substrate, it goes without saying that similar effects can be obtained even where the invention is applied to a TFT that is formed on an insulating substrate. Thus, the present invention is useful from the industrial point of view.

As described above, in the semiconductor device manufacturing method according to the present invention, the side walls constitute a part of the gate electrode by forming the side walls with a conductive material mainly made of silicon. Therefore, a GOLD structure can be obtained not in the form of the IT-LDD structure.

Because the side walls are formed by performing anisotropic or semi-anisotropic etching in an atmosphere including a halogen fluoride, the selective etching ratio of the side wall material to the gate insulating film material can be made sufficiently large. As a result, overetching of not only the semiconductor substrate but also the gate insulating film can be avoided. Thus, capable of easily controlling the etching, the present invention is suitable for mass-production of GOLD transistors.

Also, as a modification of the present invention, it is possible to conduct a pretreatment before conducting the anisotropic etching with a halogen fluoride. That is, by directing a plasma of argon vertically to the substrate face, the surface conditions on the upper surface and the side surface can be differentiated from each other. After this pretreatment, it is possible to perform an anisotropic etching using a halogen fluoride gas without energizing the gas.

What is claimed is:

1. A method of manufacturing a semiconductor device comprising the steps of:

forming a conductive film over a substrate;

treating a surface of said conductive film with an argon ion generated by plasma; and performing an anisotropic etching of said conductive film by using halogen fluoride after the treatment with the argon ion.

2. A method according to claim 1 wherein said halogen fluoride is selected from the group consisting of ClF, $ClF_3$, BrF, $BrF_3$, IF and $IF_3$.

3. A method according to claim 1 wherein said conductive film comprises polycrystalline silicon.

4. A method according to claim 1 wherein said substrate is self-biased at −50 to −200 V during the anisotropic etching.

5. A method of manufacturing a semiconductor device comprising the steps of:

forming a conductive film over a substrate;

directing a plasma of argon in a direction perpendicular to said substrate to activate a surface of said conductive film; and performing an anisotropic etching of said conductive film by using halogen fluoride after the activation of the surface of said conductive film.

6. A method according to claim 5 wherein said halogen fluoride is selected from the group consisting of ClF, $ClF_3$, BrF, $BrF_3$, IF and $IF_3$.

7. A method according to claim 5 wherein said conductive film comprises polycrystalline silicon.

8. A method according to claim 5 wherein said substrate is self-biased at −50 to −200 V during the anisotropic etching.

9. A method of manufacturing a semiconductor device comprising the steps of:

forming a gate electrode adjacent to a semiconductor film comprising silicon with a gate insulating film interposed therebetween;

forming a conductive film over said gate electrode;

treating a surface of said conductive film with an argon ion generated by plasma; and forming a side wall spacer adjacent to side surfaces of said gate electrode by an anisotropic etching of said conductive film;

wherein said anisotropic etching is performed by directing halogen fluoride toward said conductive film after the treatment with the argon ion.

10. A method according to claim 9 wherein said halogen fluoride is selected from the group consisting of ClF, $ClF_3$, BrF, $BrF_3$, IF and $IF_3$.

11. A method according to claim 9 wherein said conductive film comprises polycrystalline silicon.

12. A method according to claim 9 wherein said gate electrode comprises phosphorus doped silicon.

13. A method of manufacturing a semiconductor device comprising the steps of:

forming a gate electrode over a semiconductor film comprising silicon with a gate insulating film interposed therebetween;

forming a conductive film over said gate electrode;

treating a surface of said conductive film with an argon ion generated by plasma; and forming a side wall spacer adjacent to side surfaces of said gate electrode by an anisotropic etching of said conductive film;

wherein said anisotropic etching is performed by directing halogen fluoride toward said conductive film after the treatment with the argon ion.

14. A method according to claim 13 wherein said halogen fluoride is selected from the group consisting of ClF, $ClF_3$, BrF, $BrF_3$, IF and $IF_3$.

15. A method according to claim 13 wherein said conductive film comprises polycrystalline silicon.

16. A method of manufacturing a semiconductor device comprising the steps of:

forming a conductive film over a semiconductor film;

treating a surface of said conductive film with an argon ion generated by plasma;

performing an anisotropic etching of said conductive film using halogen fluoride after the treatment with the argon ion; and introducing an impurity ion into said semiconductor film by using the etched conductive film as a mask.

17. A method according to claim 16 wherein said halogen fluoride is selected from the group consisting of ClF, $ClF_3$, BrF, $BrF_3$, IF and $IF_3$.

18. A method according to claim 16 wherein said conductive film comprises polycrystalline silicon.

19. A method of manufacturing a semiconductor device comprising the steps of:

forming a gate electrode adjacent to a semiconductor film comprising silicon with a gate insulating film interposed therebetween;

forming a conductive film over said gate electrode;

treating a surface of said conductive film with an argon ion generated by plasma; and performing an anisotropic etching of said conductive film after the treatment with the argon ion.

20. A method according to claim 19 wherein said substrate is self-biased at −50 to −200 V during the anisotropic etching.

21. A method according to claim 19 wherein said conductive film comprises polycrystalline silicon.

22. A method of manufacturing a semiconductor device comprising the steps of:

forming a gate electrode adjacent to a semiconductor film comprising silicon with a gate insulating film interposed therebetween;

forming a conductive film silicon over said gate electrode;

treating a surface of said conductive film with an argon ion generated by plasma; and forming a side wall spacer adjacent to side surfaces of said gate electrode by an anisotropic etching of said conductive film.

23. A method according to claim 22 wherein said substrate is self-biased at −50 to −200 V during the anisotropic etching.

24. A method according to claim 22 wherein said conductive film comprises polycrystalline silicon.

* * * * *